US011262785B2

(12) United States Patent
Monroe et al.

(10) Patent No.: US 11,262,785 B2
(45) Date of Patent: Mar. 1, 2022

(54) METHODS AND APPARATUSES FOR IDENTIFYING AND CONTROLLING QUANTUM EMITTERS IN A QUANTUM SYSTEM

(71) Applicant: University of Maryland, College Park, College Park, MD (US)

(72) Inventors: Christopher Monroe, Ellicott City, MD (US); Jiehang Zhang, College Park, MD (US); David Wong-Campos, Hyattsville, MD (US); Antonios Kyprianidis, Takoma, MD (US); Patrick Michael Becker, College Park, MD (US)

(73) Assignee: University of Maryland, College Park, College Park, MD (US)

(*) Notice: Subject to any disclaimer, the term of this patent is extended or adjusted under 35 U.S.C. 154(b) by 518 days.

(21) Appl. No.: 16/239,084

(22) Filed: Jan. 3, 2019

(65) Prior Publication Data
US 2019/0212766 A1   Jul. 11, 2019

Related U.S. Application Data

(60) Provisional application No. 62/614,108, filed on Jan. 5, 2018.

(51) Int. Cl.
*G06N 10/00* (2019.01)
*G06E 3/00* (2006.01)
(Continued)

(52) U.S. Cl.
CPC .............. *G06E 3/005* (2013.01); *B82Y 10/00* (2013.01); *B82Y 40/00* (2013.01); *G01J 1/42* (2013.01);
(Continued)

(58) Field of Classification Search
CPC .......... G01J 1/42; G06E 3/005; G06N 10/00; B82Y 10/00; B82Y 40/00; H01L 29/127; H01L 29/66977
(Continued)

(56) References Cited

U.S. PATENT DOCUMENTS 9,075,283 B2 * 7/2015 Senellart ............... H04L 9/0858

OTHER PUBLICATIONS

Paul, W., Electromagnetic traps for charged and neutral particles, Rev. Mod. Phys. vol. 62, (1990), 12 pages.
(Continued)

*Primary Examiner* — Que Tan Le
(74) *Attorney, Agent, or Firm* — Arent Fox LLP

(57) ABSTRACT

The disclosure describes an adaptive and optimal imaging of individual quantum emitters within a lattice or optical field of view for quantum computing. Advanced image processing techniques are described to identify individual optically active quantum bits (qubits) with an imager. Images of individual and optically-resolved quantum emitters fluorescing as a lattice are decomposed and recognized based on fluorescence. Expected spatial distributions of the quantum emitters guides the processing, which uses adaptive fitting of peak distribution functions to determine the number of quantum emitters in real time. These techniques can be used for the loading process, where atoms or ions enter the trap one-by-one, for the identification of solid-state emitters, and for internal state-detection of the quantum emitters, where each emitter can be fluorescent or dark depending on its internal state. This latter application is relevant to efficient and fast detection of optically active qubits in quantum simulations and quantum computing.

15 Claims, 11 Drawing Sheets

(51) Int. Cl.
*G01J 1/42* (2006.01)
*H01L 29/66* (2006.01)
*B82Y 10/00* (2011.01)
*B82Y 40/00* (2011.01)
*G01N 21/64* (2006.01)

(52) U.S. Cl.
CPC ..... *H01L 29/66977* (2013.01); *G01J 2001/4247* (2013.01); *G01N 21/6458* (2013.01); *G06N 10/00* (2019.01)

(58) Field of Classification Search
USPC .................................. 250/214.1, 205, 214 R
See application file for complete search history.

(56) References Cited

OTHER PUBLICATIONS

Nielsen, M.A., et al., Quantum Computation and Quantum Information (Cambridge University Press, Address, 2000, 17 pages.
Ladd, T.D., et al., Quantum Computing, Nature 464, 45 (2010), 26 pages.
Quantum Simulation, Nature Physics, Insight Issue, vol. 8, Apr. 2012, 1 page.
Monroe, Christopher R., et al., Quantum Computing with Ions, Scientific American, Aug. 2008, 9 pages.
Blatt, Rainer, et al., Entangled States of Trapped Atomic Ions, Nature, vol. 453, Jun. 19, 2008, 8 pages.
Monroe, C., et al., Scaling the Ion Trap Quantum Processor, Science 339, 2013, 7 pages.
Brown, Kenneth et al., Co-designing a scalable quantum computer with trapped atomic ions, Nature Quantum Information 2, 2016, 10 pages.
Maiwald, Robert, et al., Stylus ion trap for enhanced access and sensing, Nature Physics, vol. 5, Aug. 2009, 4 pages.
Rosenband, T. et al., Frequency Ratio of Al+ and Hg+ Single-Ion Optical Clocks; Metrology at the 17th Decimal Place, Science 319, 2008, 6 pages.
Dehmelt, H., Experiments with an Isolated Subatomic Particle at Rest, Nobel Lecture, Dec. 8, 1989, 13 pages.
Paul, Wolfgang, Electromagnetic traps for charged and neutral particles, Rev. Mod. Phys. vol. 62, (1990), 12 pages.
Wineland, D.J., et al., Laser Cooling of Atoms, Physical Review A, vol. 20, No. 4, Oct. 1979, 20 pages.
Schiffer, J.P., Phase Transitions in Anisotropically Confined Ionic Crystals, Physical Review Letters, vol. 70, No. 6, Feb. 8, 1993, 5 pages.
James, D.F.V., Quantum dynamics of cold trapped ions with application to quantum computation, Applied Physics B Lasers and Optics 66, 1998, 10 pages.
Leibfried, D., et al., Quantum dynamics of single trapped ions, Review of Modern Physics, vol. 75, Jan. 2003, 44 pages.
Dlmschenk, S., et al., Manipulation and detection of a trapped Yb+ hyperfine qubit, Physical Review A, vol. 76, 2007, 9 pages.
Hume,. D., et al., High-Fidelity, Adaptive Qubit Measurements through Repetitive Information transfer, Physical Review Letters, vol. 99, 2007, 4 pages.
Myerson, A., et al., High-fidelity readout of trapped-ion quibits, Physical Review Letters 100, 2008, 4 pages.
Burrell, A., et al., Scalable simultaneous muliti-qubit readout with 99.99% single-shot fidelity, Physical Review A 81, 2010, 4 pages.
Deslauriers, L., et al., Efficient photoionization loading of trapped ions with ultrafast pulses, Physical Review A 74 063421 (2006).
Kielpinski, D. et al., Architecture for a large-scale ion-trap quantum computer, Nature, vol. 417, Jun. 15, 2002, 3 pages.
Shen, C., et al., Correcting detection errors in quantum state engineering through data processing, New Journal of Physics 14, 2002, 10 pages.

* cited by examiner

METHODS AND APPARATUSES FOR IDENTIFYING AND CONTROLLING QUANTUM EMITTERS IN A QUANTUM SYSTEM

CROSS REFERENCE TO RELATED APPLICATIONS

The present application claims priority to and the benefit of U.S. Provisional Patent Application No. 62/614,108, entitled "ADAPTIVE AND OPTIMAL IMAGING OF QUANTUM OPTICAL SYSTEM FOR QUANTUM COMPUTING," and filed on Jan. 5, 2018, the contents of which are incorporated herein by reference in their entirety.

GOVERNMENT LICENSE RIGHTS

This invention was made with government support under H9823015CO345 awarded by the MPO, W911NF1410599 awarded by the Army Research Office (ARO), and W911NF1610082 awarded by the Intelligence Advanced Research Projects Activity (IARPA). The government has certain rights in the invention.

BACKGROUND OF THE DISCLOSURE

Aspects of the present disclosure generally relate to quantum computing systems, and more specifically, to adaptive and optimal imaging of quantum optical systems for quantum computing.

Individual optically-active quantum systems such as trapped atoms are one of the leading implementations for quantum information processing. Atomic-based qubits can be used as quantum memories, can host quantum gates in quantum computers and simulators, and can act as nodes for quantum communication networks. Qubits based on trapped atomic ions enjoy a rare combination of attributes. For example, qubits based on trapped atomic ions have very good coherence properties, can be prepared and measured with nearly 100% efficiency, and are readily entangled with each other by modulating their Coulomb interaction or remote photonic interconnects. Lattice of cold (e.g., laser-cooled) trapped atoms have also proven useful for precision metrology, including sensors of small forces and atomic clocks.

Accurate and controlled placement and number of quantum systems such as trapped atomic ions is critical in the operation of systems that provide quantum information processing and in the ability of such systems to be configurable. Accordingly, imaging devices and image processing algorithms are needed to ensure that the placement, number, and/or state of quantum systems such as atomic ions is appropriate for proper operation.

Therefore, techniques that allow for adaptive and optimal imaging of individual optically-active quantum systems such as trapped atoms, ions, or other optically active quantum system within a lattice are desirable.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect of the disclosure, various techniques are described for imaging quantum systems such as individual quantum emitters (e.g., atoms, ions, solid-state quantum emitters such as quantum dots) based on their fluorescence, allowing the fast and accurate determination of the number of quantum emitters or equivalent quantum systems fluorescing in the trap. As part of these techniques, image processing algorithms are described to adaptively determine the positions of individual quantum emitters immersed in a lattice or in a field of view, for both the identification of quantum emitters during the loading procedure, for the identification of solid-state emitters, and also for the high-efficiency detection of the qubit state of each quantum emitter, for example at the conclusion of a quantum computation.

In an aspect of this disclosure, a method for identification of optically active quantum systems that include one or more individual quantum emitters is described that includes providing an optical source that produces fluorescence from the quantum emitters as they are loaded into a trap, each of the quantum emitters behaving as an optical object having a certain intensity distribution in response to the fluorescence, identifying a position of each of the quantum emitters by fitting the overall intensity distribution to a sum of a variable number of Gaussian functions, and controlling, in real-time, a number of quantum emitters that are loaded into the trap based at least on the identified positions of each of the quantum emitters and whether one or more of the quantum emitters are not fluorescing.

In another aspect of this disclosure, a method for identification of quantum emitters is described that includes preparing, for each of multiple trapped quantum emitters, a particular quantum state that fluoresces while keeping all other quantum emitters in a different quantum state to establish an individual basis intensity distribution for each of the multiple trapped quantum emitters, determining a peak intensity for the multiple trapped quantum emitters in a particular quantum state that fluoresces, performing a maximum likelihood method to decompose a distribution of the peak intensities into a best fit linear combination of all of the individual basis intensity distribution, and identifying a qubit value for the multiple trapped quantum emitters based on results from the maximum likelihood method decomposition.

In another aspect of this disclosure, a quantum information processing (QIP) system is described that includes a quantum emitter lattice, an optical controller configured to provide an optical source that produces fluorescence on the quantum emitters as they are loaded into the lattice, each of the quantum emitters behaving as a point-source optical object having a certain intensity in response to the fluorescence, and an imaging system configured to identify a position of each of the quantum emitters by fitting the overall intensity distribution to a sum of a variable number of Gaussian function, and control, in real-time, a number of quantum emitters that are loaded into the lattice based at least on the identified positions of each of the quantum emitters and whether any of the atoms is not fluorescing.

In another aspect of this disclosure, a QIP system is described that includes a quantum emitter lattice, an optical controller configured to prepare, for each of multiple quantum emitters trapped in the lattice, a bright qubit state while keeping all other quantum emitters in a dark qubit state to establish an individual basis intensity distribution for each of the multiple trapped quantum emitters, and an imaging system configured to determine a peak intensity for the multiple trapped quantum emitters in a bright qubit state, perform a maximum likelihood method to decompose a distribution of the peak intensities into a best fit linear combination of all of the individual basis intensity distributions, and identify a qubit value for the multiple trapped quantum emitters based on results from the maximum likelihood method decomposition.

In another aspect of this disclosure, a computer-readable medium storing code with instructions executable by a processor for identification of quantum emitters is described that includes code for providing an optical source that produces fluorescence on the quantum emitters as they are loaded into a lattice, each of the quantum emitters behaving as a point-source optical object having a certain intensity in response to the fluorescence, code for identifying a position of each of the quantum emitters by fitting the overall intensity distribution to a sum of a variable number of Gaussian functions, and code for controlling, in real-time, a number of quantum emitters that are loaded into the lattice based at least on the identified positions of each of the quantum emitters and whether any of the quantum emitters is not fluorescing.

In another aspect of this disclosure, a computer-readable medium storing code with instructions executable by a processor for identification of quantum emitters is described that include code for preparing, for each of multiple trapped quantum emitters, a bright qubit state while keeping all other quantum emitters in a dark qubit state to establish an individual basis intensity distribution for each of the multiple trapped quantum emitters, code for determining a peak intensity for the multiple trapped quantum emitters in a bright qubit state, code for performing a maximum likelihood method to decompose a distribution of the peak intensities into a best fit linear combination of all of the individual basis intensity distributions, and code for identifying a qubit value for the multiple trapped quantum emitters based on results from the maximum likelihood method decomposition.

In yet another aspect of this disclosure, a method for identification of optically active quantum systems that include one or more individual quantum emitters is described where the method includes providing an optical source that produces fluorescence from the quantum emitters within an optical field of view, each of the quantum emitters behaving as an optical object having a certain intensity distribution in response to the fluorescence, identifying a position of each of the quantum emitters by fitting the overall intensity distribution to a sum of a variable number of Gaussian functions, and controlling, in real-time, a number of quantum emitters that are within the field of view based at least on the identified positions of each of the quantum emitters and whether one or more of the quantum emitters are not fluorescing.

Described herein are methods, apparatuses, and computer-readable storage medium for various aspects associated with adaptive and optimal imaging of quantum optical systems for quantum computing. These techniques may also be useful for quantum metrology and sensing applications.

BRIEF DESCRIPTION OF THE DRAWINGS

The appended drawings illustrate only some implementation and are therefore not to be considered limiting of scope.

DETAILED DESCRIPTION

Figure 1A:
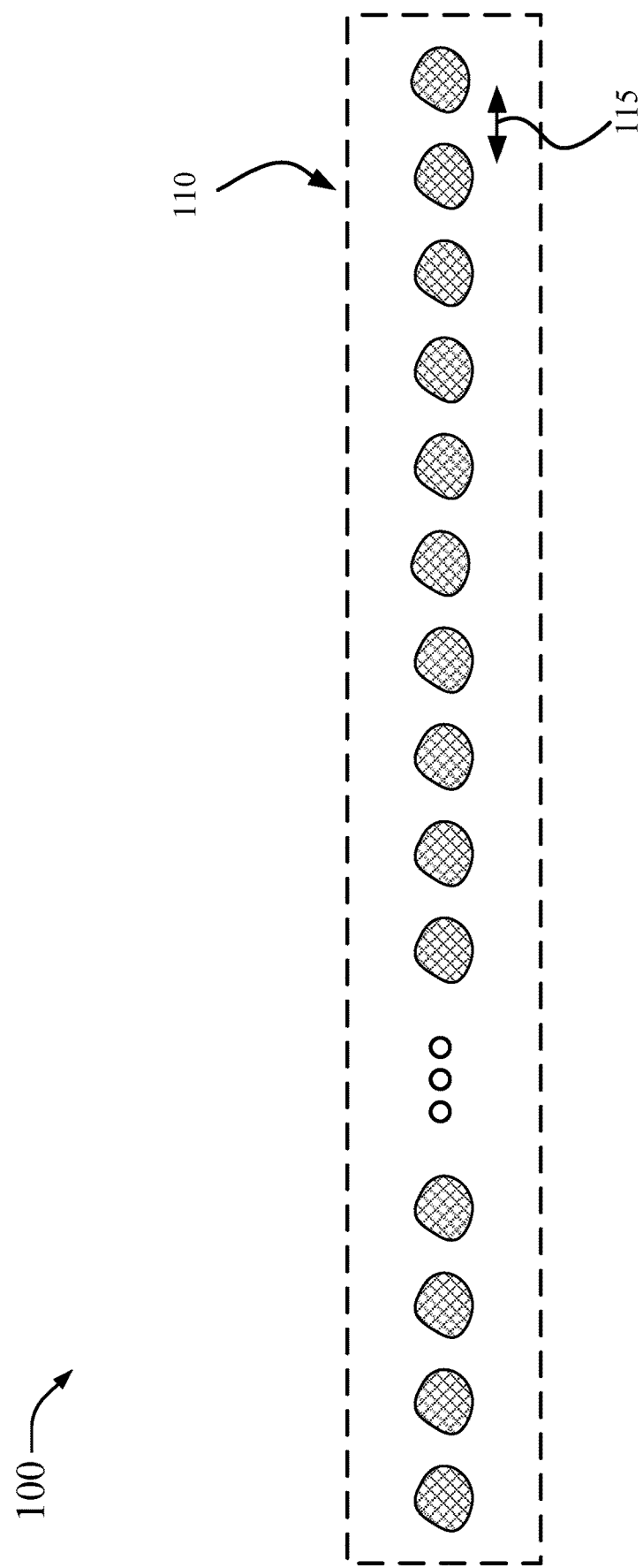
FIG. 1A illustrates a view of a vacuum chamber that houses electrodes for the trapping of atomic ions a linear lattice in accordance with aspects of the disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As described above, trapped atoms may be used to implement quantum information processing. Atomic-based qubits can be used as different type of devices, including but not limited to quantum memories, the host of quantum gates in quantum computers and simulators, and nodes for quantum communication networks. Qubits based on trapped atomic ions (atoms with a net state of electrical charge) can have very good coherence properties, can be prepared and measured with nearly 100% efficiency, and can be readily entangled with each other by modulating their Coulomb interaction or remote photonic interconnects. Lattices of cold (e.g., laser-cooled) trapped atoms have also proven useful for precision metrology, including sensors of small forces and atomic clocks.

In addition to trapped atoms or ions, quantum information processing can be performed using solid-state qubits, which like some atoms or ions can be optically active. Solid-state qubits are locked in as part of the fundamental atomic lattice making up the solid; they are usually single isolated defects or grain boundaries that make an effective "atomic-like" system inside the solid and therefore in this instances there is not trap to contain the solid-state qubits. However, these types of qubits can diffuse around a bit, they can change character or properties with electrical strain or other types of fields, and can blink off or bleach when illuminated by light. Therefore, solid-state qubits or solid-state quantum emitters have many of the same features that are used for imaging trapped ions and, consequently, many of the imaging aspects described herein that are applicable to trapped atoms or ions may also be applicable to the imaging of solid-state qubits in a field of view.

As used in this disclosure, the terms "atoms," "atomic ions," and "ions" may be used interchangeably to describe the particles that are isolated and controlled or are actually confined in a trap to form a lattice or similar arrangement or configuration. Moreover, for optically-active systems or optically-active quantum bits, the term "quantum emitter" may be used to refer to an "atom," "atomic ion," "ion", "solid-state quantum emitter", "quantum dot" or some other system that can be made to emit radiation that can be imaged or detected. Where the charge state of the atom (neutral atom or any charge state of the atomic ion) is not relevant, the disclosure described techniques that can be used for any type of neutral atom or atomic ion or other type of optically active quantum system. This disclosure describes techniques in the form of methods or processes and equipment or apparatuses for imaging trapped atoms based on their fluorescence. These techniques can be used for both the identification of atomic ions during the loading procedure and also for the high-efficiency detection of the qubit state of each atomic ion, for example at the conclusion of a quantum computation.

In the case of atomic ions, the typical ion trap geometry or structure used for quantum information and metrology purposes is the linear radio frequency (RF) Paul trap (also referred to as an RF trap or simply a Paul trap), where nearby electrodes hold static and dynamic electrical potentials that lead to an effective inhomogeneous harmonic confinement of the ions. The RF Paul trap is a type of trap that uses electric fields to trap or confine charged particles in a particular region, position, or location. When atomic ions are laser-cooled to very low temperatures in such a trap, the atomic ions form a stationary lattice of qubits (e.g., a structured arrangement of qubits), with Coulomb repulsion balancing the external confinement force. For sufficient trap anisotropy, the ions can form a linear lattice along the weak direction of confinement, and this is the arrangement typically employed for applications in quantum information and metrology. As the trap anisotropy is reduced, the atomic ions undergo a series of phase transitions in their static conformation in space, evolving to a two-dimensional (2D) zig-zag or jagged type structure, then a three-dimensional (3D) helical structure, ultimately toward a spherical lattice when the three directions of confinement approach isotropy.

FIG. 1A illustrates a partial view of a vacuum chamber 100 that houses electrodes for the trapping of atomic ions in a linear lattice 110 using a linear RF Paul trap. In the example shown in FIG. 1A, a vacuum chamber in a quantum system includes electrodes for trapping 20 atomic Ytterbium ions (e.g., $^{171}Yb^+$ ions) which are confined in the linear lattice 110 and are laser-cooled to be nearly at rest. While 20 atomic ions are shown in this example, the number of atomic ions trapped can be configurable and more or fewer than 20 atomic ions may be trapped. The atoms are illuminated with laser radiation tuned to a resonance in $^{171}Yb^+$ and the fluorescence of the atomic ions is imaged onto a camera. In this example, atomic ions are separated by a distance 115 that is about 5 microns (μm) from each other as shown by fluorescence. The separation of the atomic ions is determined by a balance between the external confinement force and Coulomb repulsion.

Atomic ions are typically loaded into traps by creating a neutral atomic flux of the desired particle, and ionizing them once in the trapping volume. Ions can remain confined for months, with lifetimes often limited by the level of vacuum. Elastic collisions with residual background gas occur roughly once per hour per ion at typical ultra-high vacuum (UHV) pressures (~$10^{-11}$ torr) and do not necessarily eject the ion from its position in the trap, although inelastic collisions can change the species or isotope of the trapped ion. Cryogenic chambers can virtually eliminate these collision events by further reducing the background pressure (e.g., limiting the outgassing of materials).

Figure 1B:
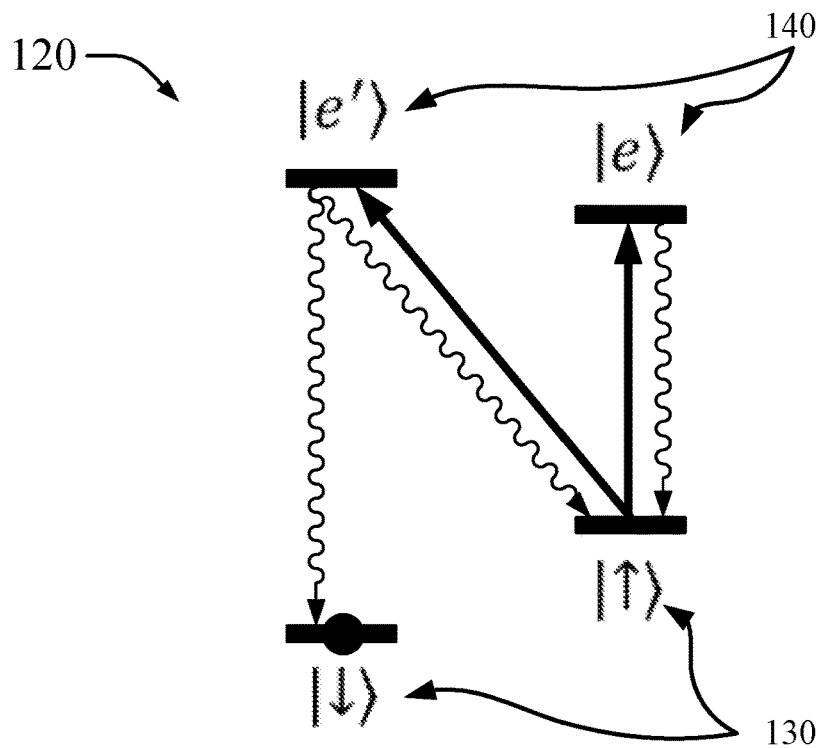
FIG. 1B is a diagram illustrating an example of a reduced energy level diagram showing the application of laser radiation for state initialization in accordance with aspects of the disclosure.
Figure 1C:
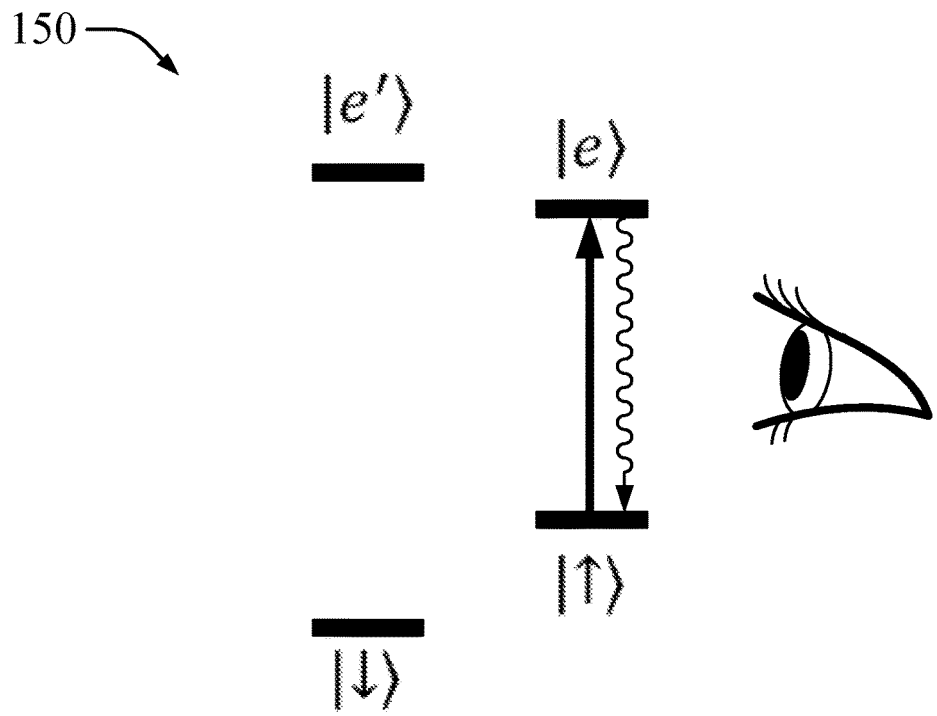
FIG. 1C is a diagram illustrating an example of a reduced energy level diagram showing the application of laser radiation for qubit state detection through fluorescence in accordance with aspects of the disclosure.

Strong fluorescence of individual trapped atomic ions relies on the efficient cycling of photons, thus the atomic structure of the ion must have a strong closed optical transition that allows for laser-cooling of the motion, qubit state initialization, and efficient qubit readout. This may rule out many atomic ion species, apart from simple atomic ions with a lone outer electron, such as the alkaline-earths ($Be^+$, $Mg^+$, $Ca^+$, $Sr^+$, $Ba^+$) and particular transition metals ($Zn^+$, $Hg^+$, $Cd^+$, and $Yb^+$). Within these atomic ions, quantum bits can be represented by two stable electronic levels, often characterized by an effective spin with the two states $|\uparrow\rangle$ and $|\downarrow\rangle$, or equivalently $|1\rangle$ and $|0\rangle$. FIG. 1B and FIG. 1C show the reduced energy level diagrams 120 and 150, respectively, for atomic ion $^{171}Yb^+$, where the qubit levels $|\uparrow\rangle$ and $|\downarrow\rangle$ 130 are represented by the stable hyperfine levels in the ground electronic state, and are separated by frequency near $\omega_0/2\pi$=12.642 GHz. The excited electronic states $|e\rangle$ and $|e'\rangle$ 140 in $^{171}Yb^+$ are themselves split by a smaller hyperfine coupling and are separated from the ground states by an optical interval having an energy corresponding to an optical wavelength of 369.53 nm.

Laser radiation tuned just below resonance in these optical transitions allows for Doppler laser cooling to confine the atomic ions near the bottom of the trap. Other more sophisticated forms of laser cooling can bring the atomic ions to be nearly at rest in the trap.

When a bichromatic laser beam (e.g., a beam with two tones produced by sidebands resulting from optical modulation) resonant with both $|\uparrow\rangle \leftrightarrow |e\rangle$ and $|\uparrow\rangle \leftrightarrow |e'\rangle$ transitions is applied to the atom, it rapidly falls into the state $|\downarrow\rangle$ and no longer interacts with the light field, allowing the initialization of the qubit with essentially 100% fidelity (see e.g., FIG. 1B).

When a single laser beam resonant with the $|\uparrow\rangle \leftrightarrow |e\rangle$ transition is applied, a closed cycling optical transition causes an ion in the $|\uparrow\rangle$ state to fluoresce strongly while an ion in the $|\downarrow\rangle$ state stays dark because the laser frequency is far from its resonance (see e.g., FIG. 1C). The collection of even a small fraction of this fluorescence allows for the detection of the atomic qubit state with near-perfect efficiency or accuracy. Other atomic species may have similar initialization/detection schemes.

In FIGS. 1B and 1C, all allowed transitions from the excited electronic states $|e\rangle$ and $|e'\rangle$ 140 are illustrated as downward, wavy arrows. On the other hand, the applied laser radiation (which is shown as upward, straight arrows) drive these transitions for initialization to state $|\downarrow\rangle$ as shown in FIG. 1B, and for fluorescence detection of the qubit state ($|\uparrow\rangle$=fluorescence, $|\downarrow\rangle$=no fluorescence) as shown in FIG. 1C.

This disclosure describes various aspects of techniques for fluorescence imaging of trapped ion lattices. When detecting the fluorescence of multiple trapped ions in a stable lattice line configuration (e.g., the lattice 110 in FIG. 1A), it is important to distinguish each ion in position, not only to diagnose the structure of the lattice, but also to detect individual qubits. The potential for crosstalk between the various ions can give rise to errors in the effective detection of qubits. Moreover, in densely-packed lattices with imperfect optical images captured from the fluorescence, it may be challenging to unambiguously identify each atomic ion in the lattice. These challenges may be mitigated based on the techniques described below.

For any of these techniques, a standard CCD camera (or other similar camera, imaging device, or imager such as a CMOS-based imager), some with a photomultiplier (PMT) gain, others with semiconductor gain. For any camera, the readout speed is a critical parameter that can limit the data rate of formation of the ion lattice image, and also the readout time for a register of qubits. Examples of CCD cameras that may be used include CCD cameras from Princeton Electronics and Andor.

The various imaging systems and techniques described in this disclosure can be used for both the rapid identification of atomic ions during the loading of the ions into a trap and also for the high-efficiency detection of the qubit state of each atomic ion, for example at the conclusion of a quantum computation. For typical applications, it is important to know exactly how many ions are confined in the trap. The various imaging systems and techniques described in this disclosure allow for the real-time determination of ion number for loading and for qubit state detection.

Ion traps are generally loaded with ions that are photoionized from a neutral atomic beam flux. The ions can appear suddenly (e.g., in a group), or also can appear one-by-one with appropriate control of the photoionization laser intensity. Once the ions are loaded, laser cooling immediately localizes them to the nanometer-scale in space (e.g., to a fixed or quasi-fixed location), and they behave as effective point-source optical objects. By having a trapped ion fluoresce and then imaging of the fluorescence onto a camera (e.g., a 2D camera), it is possible to perform an identification (e.g., location, number, and/or state) of the trapped ion. In an alternative approach, trapped ions can be loaded from a complex multi-zone trap whereby individual trapped ions are shuttled from a previously-loaded trap zone to an experimental or operational zone where the fluorescence is collected or detected.

The positions of the individual atoms may be determined by fitting the overall intensity distribution to a sum of a variable number of Gaussian functions. It is then possible to determine the peak positions by calculating the "Laplacian of Gaussians" (LoG) algorithm whose zeroes indicate the inflection point of the intensity distribution for each peak. In the LoG algorithm, the Laplacian is a 2D isotropic measure of the second spatial derivative of an image. The Laplacian of an image highlights regions of rapid intensity change and is therefore often used for edge detection. The Laplacian is often applied to an image that has first been smoothed with something approximating a Gaussian smoothing filter in order to reduce its sensitivity to noise. The LoG algorithm may also be referred to simply as Laplacian or Marr filter. A "Difference of Gaussians" (DoG) algorithm may be used instead to quickly approximate the Laplacian, as subtracting two Gaussians with different widths essentially produces a second derivative. The DoG is an algorithm that involves the subtraction of one blurred version of an original image from a less blurred version of the original image. In the case of grayscale images, the blurred images are produced by the convolution of the original grayscale images with Gaussian kernels having differing standard deviations to suppress high-frequency spatial information. The DoG algorithm is therefore a bandpass filter that removes spatial frequencies from the original grayscale image. The technique described above, whether using the LoG algorithm or DoG algorithm, returns regions of local maxima, which are easy to find even if the individual atomic images overlap strongly.

The expected relative positions of atomic ions in an ion trap may be estimated and used as an initial best-guess for the ion positions, given only the number of ions in the trap. There are many different conformations for the atomic ions in a lattice, from the simplest 1D line, to 2D zig-zag lattices and then evolving to a series of 3D helical structures. The relative spacing of atomic ions in these configurations may be computed or determined for lattices of up to 100 or more atomic ions. For insufficient anisotropy in the confinement, many atomic ions will form 3D conformations and exhibit out-of-focus images, which may not allow unambiguous identification of individual atoms. However, for 1D (e.g., line lattices) and 2D (e.g., zig-zag or jagged lattices) structures, the identification of individual atomic ions should work well, and even some simple 3D structures can be accurately characterized.

Figure 2A:
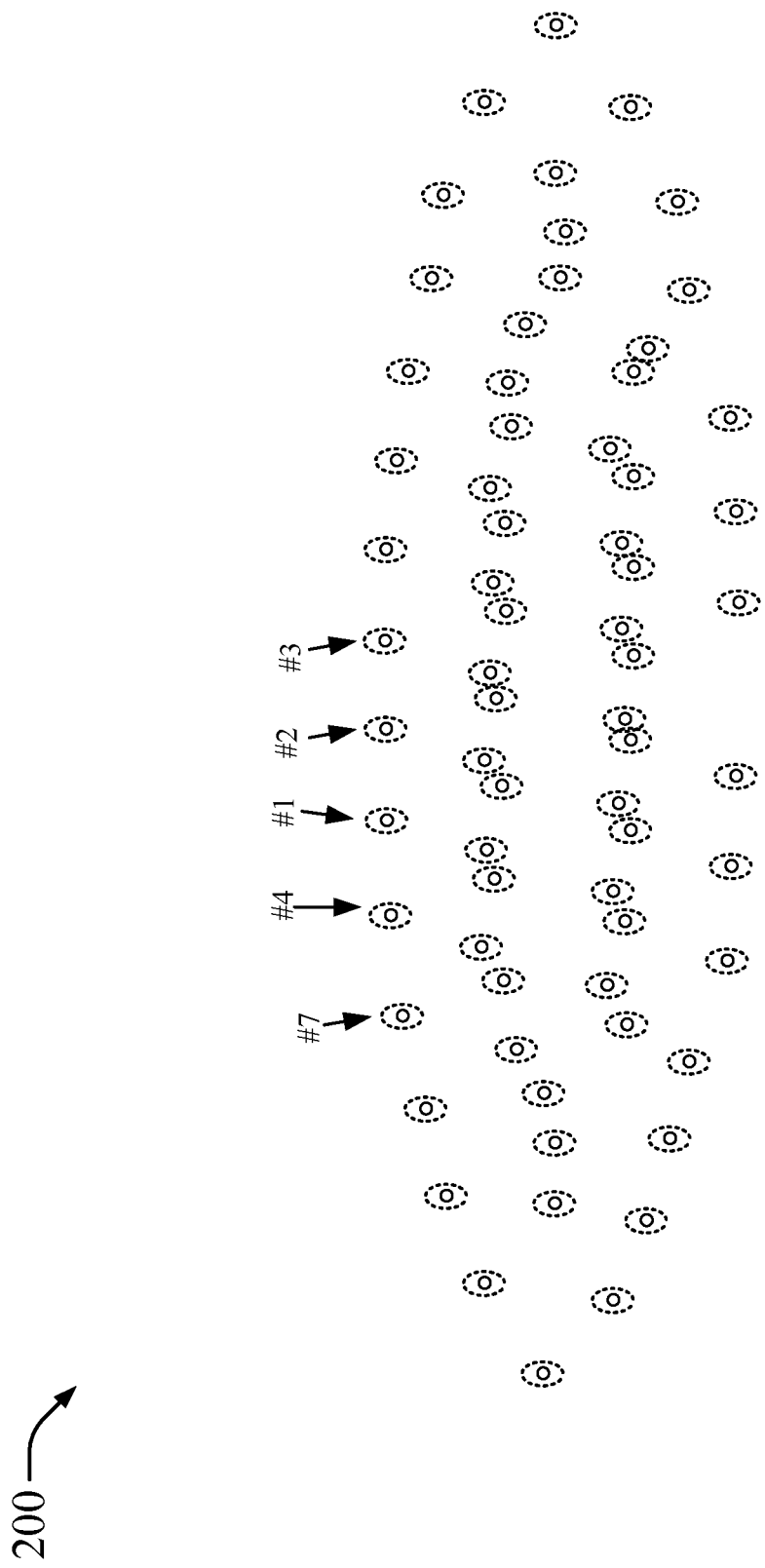
FIGS. 2A and 2B are images that illustrate examples of identification and labeling of fluorescing atoms using imaging techniques in accordance with an aspect of the disclosure.
Figure 2B:
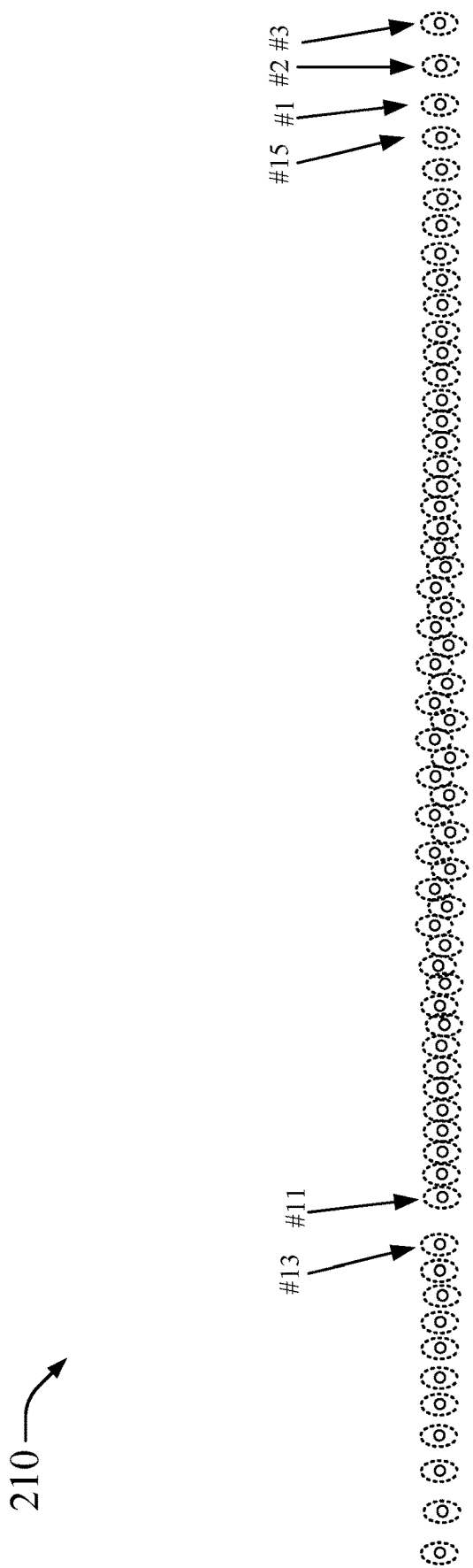
Figure 2C:
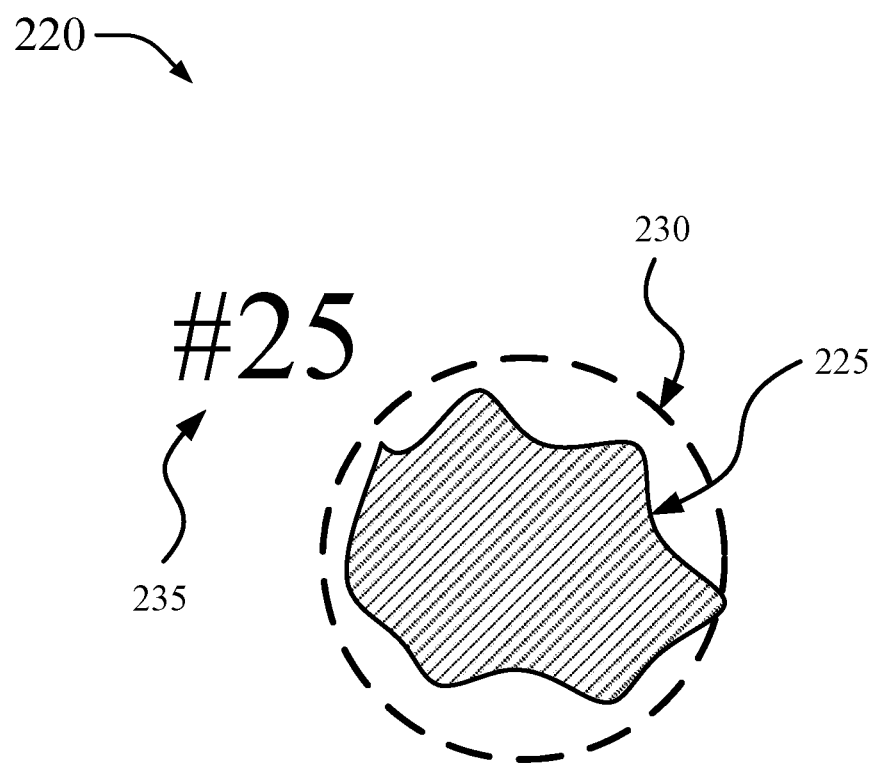
FIG. 2C is a diagram illustrating an example of the type of identification provided by the imaging techniques described in accordance with an aspect of the disclosure.

FIG. 2A and FIG. 2B show representations of images 200 and 210, respectively, that illustrate examples of identification and labeling of fluorescing atomic ions using imaging techniques in accordance with an aspect of the disclosure. Image 200 in FIG. 2A shows 67 trapped $^{171}Yb^+$ ions held in 3D (likely helical) structure. The image processing algorithms described in this disclosure are used to identify each atomic ion by its characteristic narrow intensity (fluorescing) pattern, and may also label each ion with a sequential number by, for example, providing a circle and number for each identified ion—see e.g. FIG. 2C. In the image 200, a few of the ions are shown numbered for illustration, however, the full set of ions can be identified and numbered. Image 210 in FIG. 2B shows 65 trapped $^{171}Yb^+$ ions, held in a 2D zig-zag pattern, very close to the phase transition where the atoms form a 1D lattice. Again, as in FIG. 2A, the atomic ions are identified and labeled by number. In the image 210, a few of the ions are shown numbered for illustration, however, the full set of ions can be identified and numbered. FIG. 2C shows a diagram 220 in which an example of the information displayed by the image processing algorithms described in this disclosure for the identification and labeling of an atomic ion or similar qubit structure. In this example, the fluorescent pattern 225 of a single atomic ion is identified by placing a circle 230 around it. Although a circle is used in this example, other geometric figures may also be used (e.g., squares, triangles, rectangles). Moreover, the atomic ion is also labeled and/or numbered (e.g., #25) by a text identifier 235 (as also illustrated in the images 200 and 210). This allows a user and a quantum system to control and track trapped atomic ions. The positioning and/or color of the text identifier 235 relative to the fluorescent pattern 225, and the size, positioning, and/or color of the circle 230 also relative to the fluorescent pattern 225, may be configured based on operational preferences. Characteristics of the circle 230 and/or the text identifier 235 may vary within a same lattice to denote or identify certain subsets of atomic ions.

There may be instances in which a subset of atomic ions do not fluoresce in the image, but their positions are made obvious by the larger gaps in the lattice (e.g., gaps or spaces between fluorescent atomic ions as seen on the left side of FIG. 2B between ions #11 and #13). These "dark" ions may be caused from different atomic species that do not respond to the laser light, or from ions of the nominal atomic species that are trapped in a non-fluorescing state. These "dark" ions are often transient, blinking on and off, and their positions, bright or dark, are to be recorded and tracked by the image processing algorithms to keep an accurate count of ions and to account for their positions.

For rapid loading of ions and real-time analysis of the number of ions, the image processing algorithms described above may be used to process the intensity distribution, while controlling the intensity of the driving laser that photoionizes the neutral atoms. In this way, it is possible to control the number of atoms loaded into the trap and produce a targeted number of trapped atomic ions.

As described above, another area in which the image processing algorithms described in this disclosure apply is in high-efficiency simultaneous detection of qubit states in a lattice of atomic ions. In quantum information applications, trapped atomic ion qubits need to be measured through the collection of state-dependent fluorescence. This requires the ability to discriminate between the spatially resolved fluorescence patterns on the image, while minimizing crosstalk between adjacent atomic ions. Several new techniques in image recognition are described to extract these qubit measurement results on large collections of trapped ions.

Each individual atomic ion in the chain (e.g., in the chain or sequence of atomic ions of the linear lattice 100) is prepared in a "bright" (fluorescence) qubit state, with all the other atomic ions prepared in a "dark" qubit state (no fluorescence), and the single fluorescing ion image is collected. This procedure is similarly performed on all atomic ions in the chain or lattice. Alternatively, a single ion may be translated (e.g., moved) in position to known nominal positions of each atomic ion in a large collection. In this way, the basis intensity distribution is established for each atomic ion.

With any number of ions in a "bright" qubit state (or even all of them in a "bright" qubit state), the centroids and widths of each individual atomic ion intensity (e.g., fluorescent brightness) peaks are determined as described above. This information is used to define a rough region-of-interest (ROI) for each ion, which is a set of non-overlapping circles. That is, the fluorescent pattern 225 shown in FIG. 2C is analyzed to determine its centroid and/or width in order to identify it and assign it the appropriate labeling (e.g., the circle 230 and/or the text identifier 235). These circles encompass CCD pixels that are associated with a particular ion image. This allows a lowest-order approximation to the binary measurement ("bright" or "dark") of each ion image.

A maximum likelihood method is used to decompose the general measured intensity distribution into the best fit linear combination of all N basis intensity distributions. From this inversion, the measured qubit value for each atomic ion may be determined.

In some implementations, the information from each individual CCD pixel may be used to gain even lower crosstalk errors.

Periodically, all atomic ions may be made to fluoresce brightly, with a red-detuned near-resonant laser that Doppler cools the ions and keeps them fluorescing strongly. The resulting image is used to adaptively correct for slow movements of the atomic ion positions (e.g., to correct drift over time), dropouts from losing atomic ions, and for compensation of drifts affecting crosstalk and scattered background light. This calibration data may be collected with a low duty cycle (e.g., periods of collections need not be too short) in order to not significantly affect the experimental data collection rate.

Figure 3:
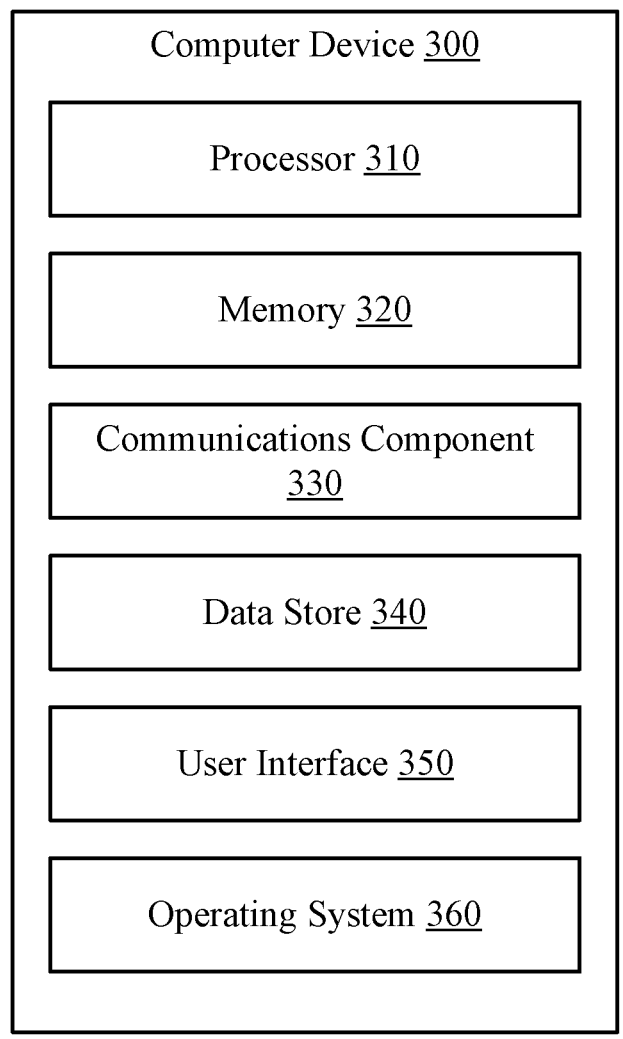
FIG. 3 is a diagram that illustrates an example of a computer device in accordance with aspects of this disclosure.

Referring now to FIG. 3, illustrated is an example computer device 300 in accordance with aspects of the disclosure. The computer device 300 can represent a single computing device, multiple computing devices, or a distributed computing system, for example. The computer device 300 may be configured as a quantum computer, a classical computer, or a combination of quantum and classical computing functions. For example, the computer device 300 may be used to process information using quantum algorithms based on trapped ion technology and may therefore implement adaptive and optimal imaging of individual trapped atomic ions within a lattice for quantum computing. A generic example of a quantum information processing (QIP) system that can implement the image processing algorithms of this disclosure for adaptive and optimal imaging of individual trapped atomic ions is illustrated in an example shown in FIGS. 6A and 6B.

In one example, the computer device 300 may include a processor 310 for carrying out processing functions associated with one or more of the features described herein. The processor 310 may include a single or multiple set of processors or multi-core processors. Moreover, the processor 310 may be implemented as an integrated processing system and/or a distributed processing system. The processor 310 may include a central processing unit (CPU), a quantum processing unit (QPU), a graphics processing unit (GPU), or combination of those types of processors. In one aspect, the processor 310 may refer to a general processor of the computer device 300, which may also include additional processors 310 to perform more specific functions such as image processing algorithms.

Figure 4A:
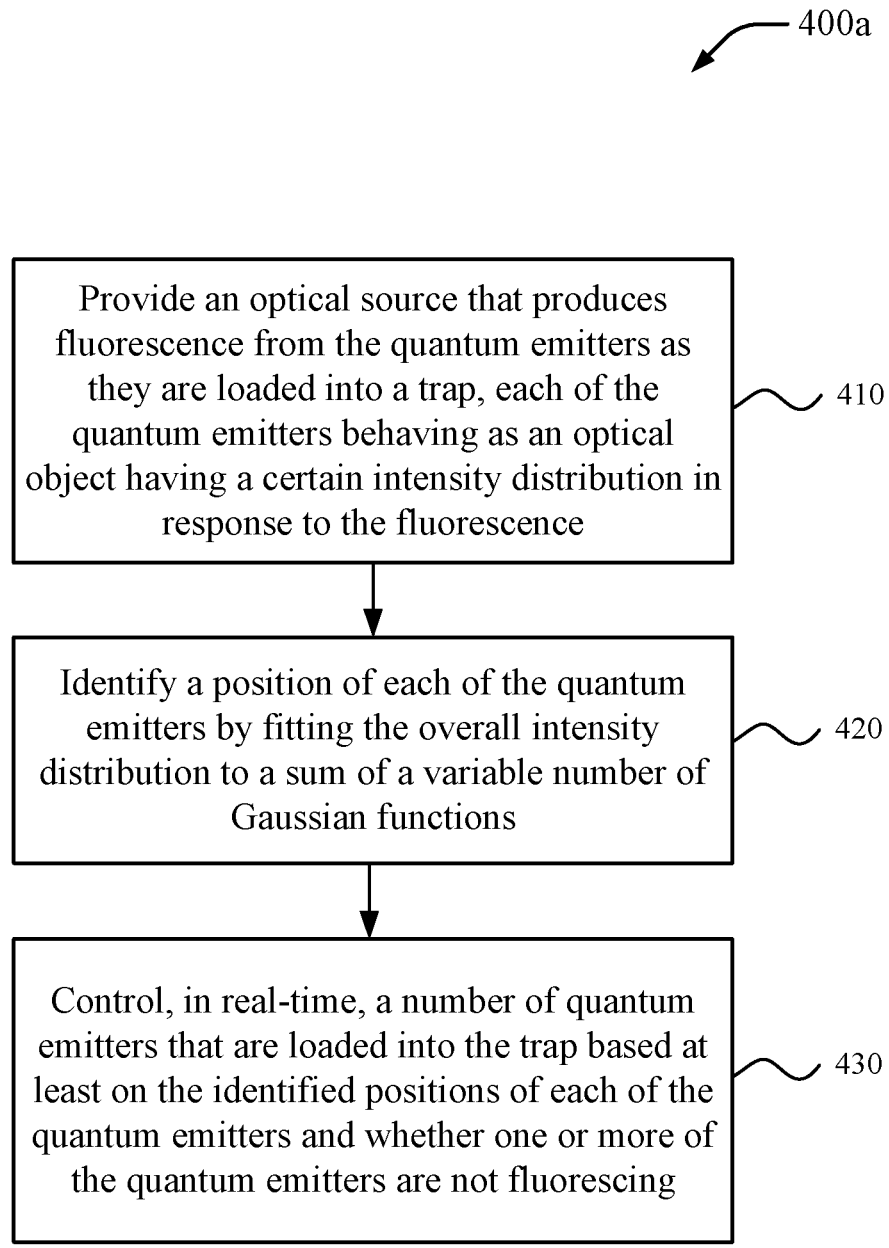
FIG. 4A is a flow diagram that illustrates an example of a method in accordance with aspects of this disclosure.

In an example, the computer device 300 may include a memory 320 for storing instructions executable by the processor 310 for carrying out the functions described herein. In an implementation, for example, the memory 320 may correspond to a computer-readable storage medium that stores code or instructions to perform one or more of the functions or operations described herein. In one example, the memory 320 may include instructions to perform aspects of a methods 400a and 400b described below in connection with FIGS. 4A and 4B, and a method 500 described below in connection with FIG. 5. Just like the processor 310, the memory 320 may refer to a general memory of the computer device 300, which may also include additional memories 320 to store instructions and/or data for more specific functions such as instructions and/or data for image processing algorithms.

Further, the computer device 300 may include a communications component 330 that provides for establishing and maintaining communications with one or more parties utilizing hardware, software, and services as described herein. The communications component 330 may carry communications between components on the computer device 300, as well as between the computer device 300 and external devices, such as devices located across a communications network and/or devices serially or locally connected to computer device 300. For example, the communications component 330 may include one or more buses, and may further include transmit chain components and receive chain components associated with a transmitter and receiver, respectively, operable for interfacing with external devices.

Additionally, the computer device 300 may include a data store 340, which can be any suitable combination of hardware and/or software, that provides for mass storage of information, databases, and programs employed in connection with implementations described herein. For example, the data store 340 may be a data repository for operating system 360 (e.g., classical OS, or quantum OS). In one implementation, the data store 340 may include the memory 320.

The computer device 300 may also include a user interface component 350 operable to receive inputs from a user of the computer device 300 and further operable to generate outputs for presentation to the user or to provide to a different system (directly or indirectly). The user interface component 350 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 350 may include one or more output devices, including but not limited to a display, a speaker, a haptic feedback mechanism, a printer, any other mechanism capable of presenting an output to a user, or any combination thereof.

In an implementation, the user interface component 350 may transmit and/or receive messages corresponding to the operation of the operating system 360. In addition, the processor 310 may execute the operating system 360 and/or applications or programs, and the memory 320 or the data store 340 may store them.

When the computer device 300 is implemented as part of a cloud-based infrastructure solution, the user interface component 350 may be used to allow a user of the cloud-based infrastructure solution to remotely interact with the computer device 300.

Figure 6A:
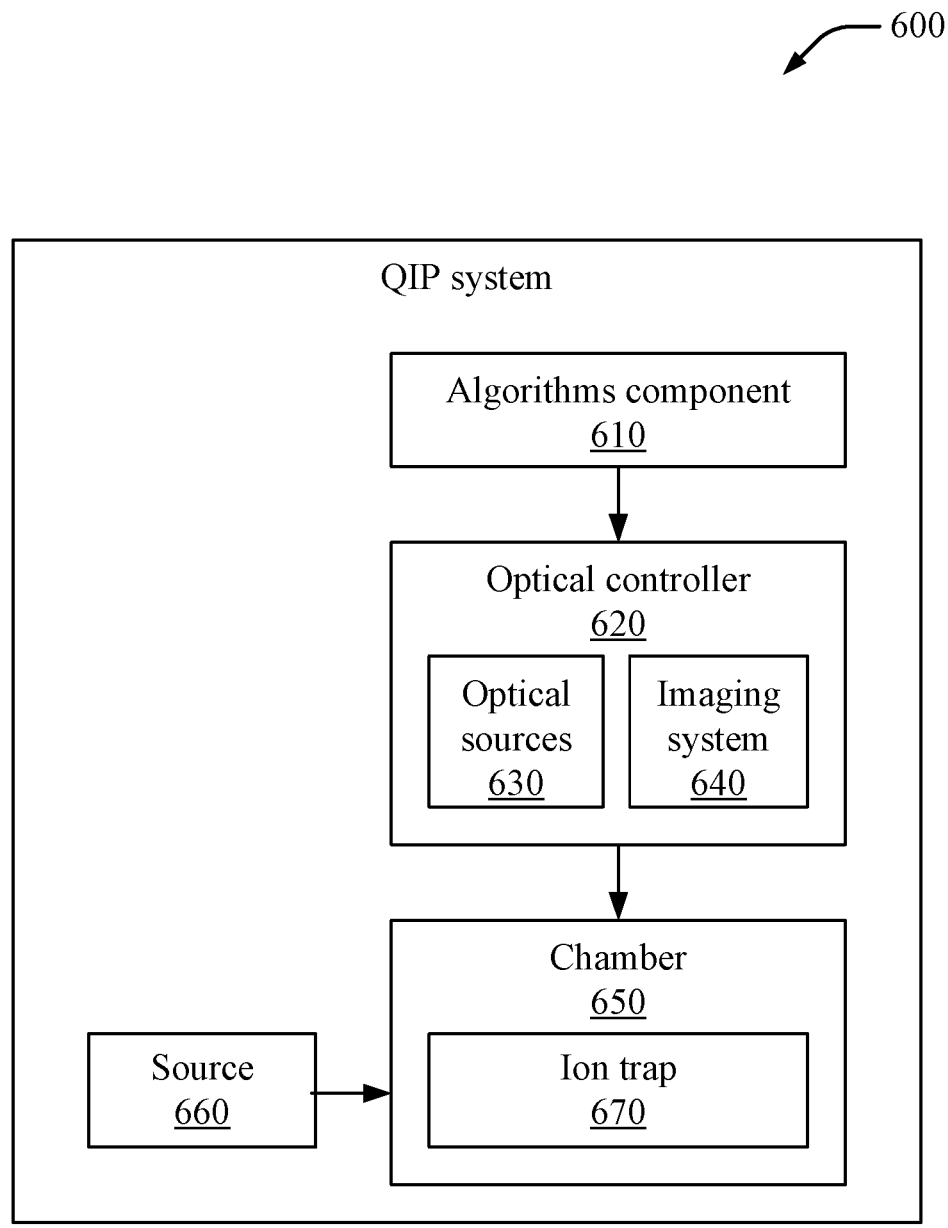
FIG. 6A is a block diagram that illustrates an example of a quantum information processing (QIP) system in accordance with aspects of this disclosure.

FIG. 4 is a flow diagram that illustrates an example of a method 400a for identification of optically active systems including one or more individual atoms in accordance with aspects of this disclosure. The method 400a is applicable to different optically-active systems or optically-active qubits in addition to individual atoms or individual ions. For example, the method 400a is also applicable to different types of quantum emitters (also referred simply as emitters) including solid-state quantum emitters such as quantum dots. In an aspect, the method 400a may be performed in a computer system such as the computer system 300 described above, where, for example, the processor 310, the memory 320, the data store 340, and/or the operating system 360 may be used to perform the functions of the method 400a. Similarly, the functions of the method 400a may be performed by one or more components of a QIP system such as a QIP system 600 as shown in FIG. 6A and its components (e.g., imaging system 640 and its subcomponents shown in FIG. 6B).

At 410, the method 400a includes providing an optical source that produces fluorescence from the quantum emitters as they are loaded into a trap, each of the quantum emitters behaving as an optical object having a certain intensity distribution in response to the fluorescence. In an aspect, a trap may refer to an atom trap or an ion trap, and may be used to confine and arrange quantum emitters such as atoms or ions.

At 420, the method 400a includes identifying a position of each of the quantum emitters by fitting the overall intensity distribution to a sum of a variable number of Gaussian functions.

At 430, the method 400a includes controlling, in real-time, a number of quantum emitters that are loaded into the trap based at least on the identified positions of each of the quantum emitters and whether one or more of the quantum emitters are not fluorescing.

In an aspect of the method 400a, the method may further include generating a flux of neutral quantum emitters including the quantum emitters, and controlling an intensity of a laser that photoionizes the neutral quantum emitters to produce ionized quantum emitters (e.g., ionizing atoms into ions).

In an aspect of the method 400a, identifying the position of each of the quantum emitters includes fitting the overall intensity distribution to the sum of a variable number of Gaussian functions comprises determining peak positions in the overall distribution of intensities by calculating the Laplacian of Gaussians whose zeros indicate an inflection point of the intensity distribution for each peak. A difference of Gaussians algorithm may be used to approximate the Laplacian of Gaussians.

In an aspect of the method 400a, identifying the position of each of the quantum emitters may include fitting the overall intensity distribution to the sum of a variable number of Gaussian functions to produce regions of local maxima corresponding to a centroid in position of each quantum emitter.

In another aspect of the method 400a, identifying the position of each of the quantum emitters by fitting the overall intensity distribution to the sum of a variable number of Gaussian functions includes determining a relative spacing between quantum emitters based on a number of quantum emitters to be trapped in the trap, determining an initial and approximate position of each of the quantum emitters based on the relative spacing, and identifying the position of each of the quantum emitters based at least in part of the initial and approximate position of each of the quantum emitters. The relative spacing may be computed for a lattice of up to 10 quantum emitters, up to 20 quantum emitters, up to 30 quantum emitters, up to 40 quantum emitters, up to 50 quantum emitters, up to 60 quantum emitters, up to 70 quantum emitters, up to 80 quantum emitters, up to 90 quantum emitters, or up to 100 quantum emitters. In some instances the relative spacing may be computed for lattices with more than 100 quantum emitters such as up to 110 quantum emitters, up to 120 quantum emitters, or more. Moreover, the relative spacing may be computed for a lattice having a one-dimensional (1D) conformation, a two-dimensional (2D) conformation, or a three-dimensional (3D) conformation of the atomic ions.

In yet another aspect of the method 400a, the method may further include performing a corrective action when the number of quantum emitters that are loaded into the trap is not the correct number, when an incorrect quantum emitter species is loaded into the trap, or when one or more of the quantum emitters loaded into the trap cannot be properly initialized.

Figure 4B:
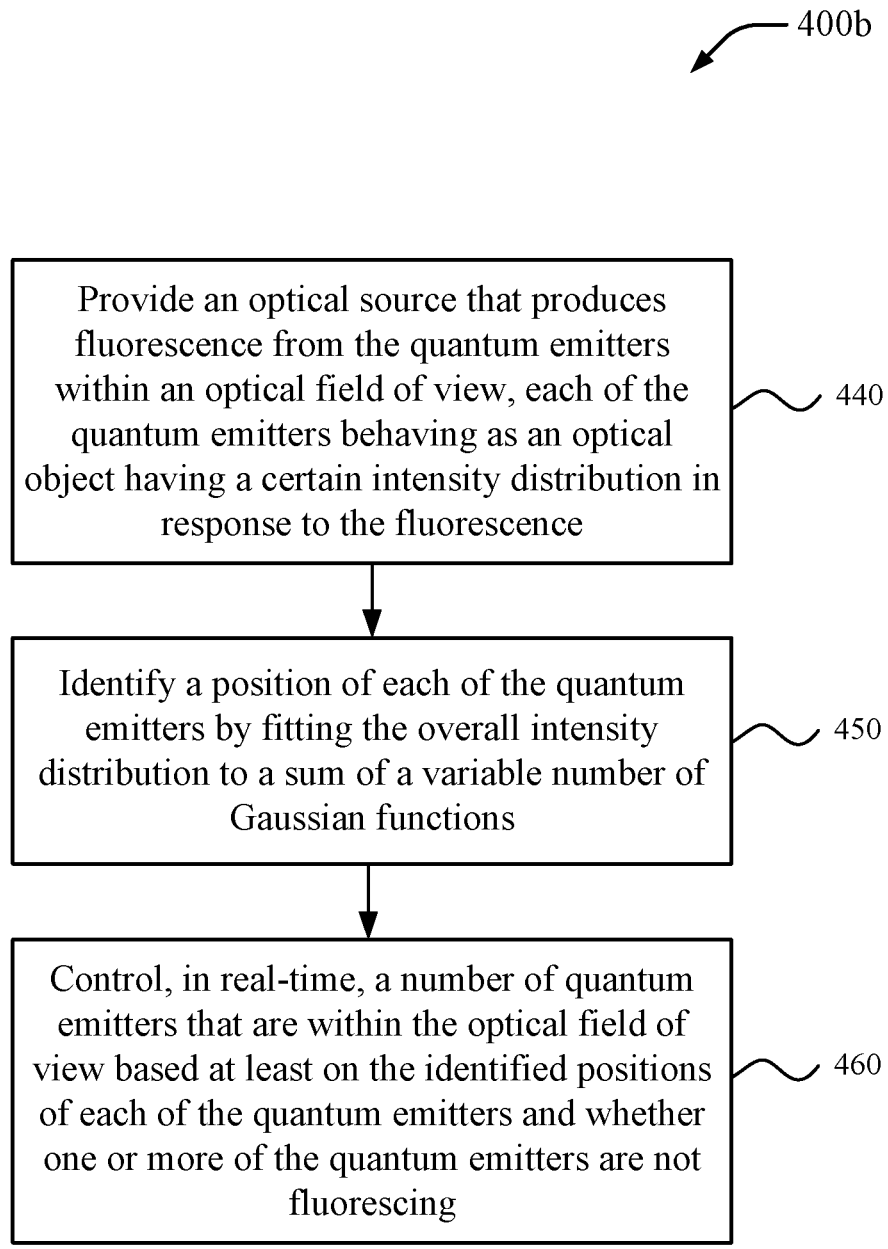
FIG. 4B is a flow diagram that illustrates an example of another method in accordance with aspects of this disclosure.

FIG. 4B is a flow diagram that illustrates an example of a method 400b for identification of optically active systems including one or more individual quantum emitters in accordance with aspects of this disclosure. The method 400b is applicable to different optically-active systems or optically-active qubits including different types of quantum emitters (e.g., atoms, ions, or solid-state quantum emitters such as quantum dots). In an aspect, the method 400b may be performed in a computer system such as the computer system 300 described above, where, for example, the processor 310, the memory 320, the data store 340, and/or the operating system 360 may be used to perform the functions of the method 400*a*. Similarly, the functions of the method 400*b* may be performed by one or more components of a QIP system such as a QIP system 600 as shown in FIG. 6A and its components (e.g., imaging system 640 and its subcomponents shown in FIG. 6B).

At 440, the method 400*b* includes providing an optical source that produces fluorescence from the quantum emitters within an optical field of view, each of the quantum emitters behaving as an optical object having a certain intensity distribution in response to the fluorescence.

At 450, the method 400*b* includes identifying a position of each of the quantum emitters by fitting the overall intensity distribution to a sum of a variable number of Gaussian functions.

At 460, the method 400*b* includes controlling, in real-time, a number of quantum emitters that are within the optical field of view based at least on the identified positions of each of the quantum emitters and whether one or more of the quantum emitters are not fluorescing.

Figure 5:
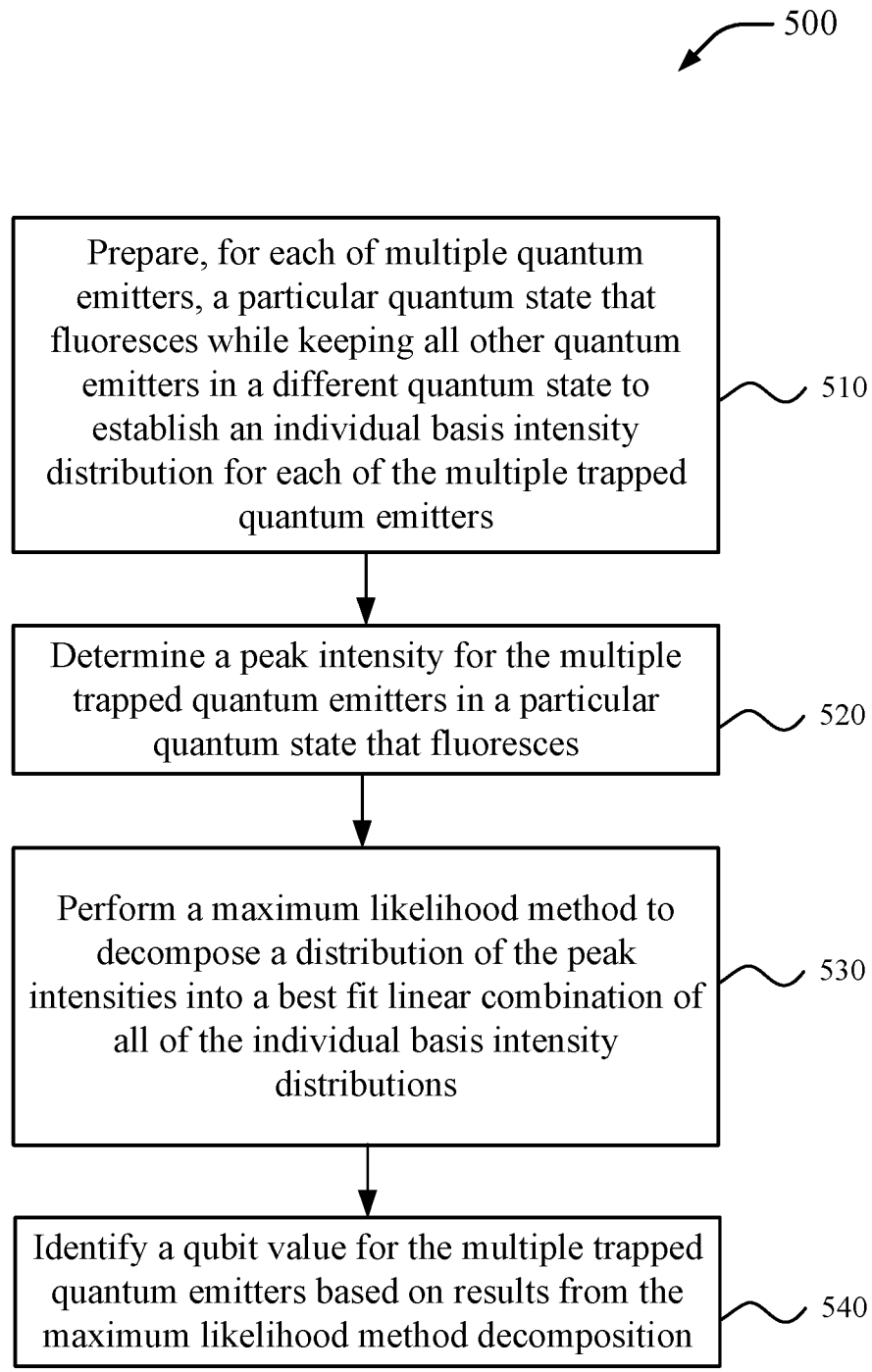
FIG. 5 is a flow diagram that illustrates an example of another method in accordance with aspects of this disclosure.

FIG. 5 is a flow diagram that illustrates an example of a method 500 for identification of atom quantum systems to detect the qubit states in accordance with aspects of this disclosure. In an aspect, the method 500 may be performed in a computer system such as the computer system 300 described above, where, for example, the processor 310, the memory 320, the data store 340, and/or the operating system 360 may be used to perform the functions of the method 500. Similarly, the functions of the method 500 may be performed by one or more components of a QIP system such as the QIP system 600 and its components (e.g., imaging system 640 and its subcomponents).

At 510, the method 500 includes preparing, for each of multiple trapped quantum emitters a particular quantum state that fluoresces while keeping all other quantum emitters in a different quantum state to establish an individual basis intensity distribution for each of the multiple trapped quantum emitters. The quantum state or qubit state that fluoresces may be referred to as a bright state or bright qubit state, while the different quantum states or qubit states may be referred to as dark states or dark qubit states.

At 520, the method 500 includes determining a peak intensity for the multiple trapped quantum emitters in a bright qubit state.

At 530, the method 500 includes performing a maximum likelihood method to decompose a distribution of the peak intensities into a best fit linear combination of all of the individual basis intensity distributions.

At 540, the method 500 includes identifying a qubit value for the multiple trapped quantum emitters based on results from the maximum likelihood method decomposition.

In an aspect of the method 500, preparing the bright qubit state for each of the multiple trapped quantum emitters and determining the peak intensity includes providing an optical source that produces fluorescence of a respective trapped quantum emitter. The optical source may be a red-detuned near-resonant laser that Doppler cools the multiple trapped quantum emitters and keeps the fluorescing strongly.

In an aspect of the method 500, identifying the qubit value includes adaptively correcting the multiple trapped quantum emitters in response to the maximum likelihood method decomposition indicating that there is a slow movement of at least a subset of the multiple trapped quantum emitters, there are dropouts from losing trapped quantum emitters, or drifts affecting crosstalk and scattered background light need compensation.

In another aspect of the method 500, determining the peak intensity for the multiple trapped quantum emitters in the bright qubit state includes identifying a region-of-interest (ROI) for each trapped atomic ion based on one or more of a centroid or a width of a respective individual peak intensity. The ROI may be labeled with one or more of a text identifier or a geometric shape encircling the respective individual peak intensity. In an example, the text identifier can indicate a number assigned to the respective trapped quantum emitter. However, other textual indicators such as combinations of letters, numbers, symbols, or the like can also be used.

In another aspect of the method 500, identifying of the qubit value for the multiple trapped quantum emitters may be performed periodically as part of a calibration procedure. In such cases, the period may be selected to be long so as to not affect regular operation.

FIG. 6A is a block diagram that illustrates an example of a QIP system 600 in accordance with aspects of this disclosure. The QIP system 600 may also be referred to as a quantum computing system, a computer device, or the like. In an aspect, the QIP system 600 may correspond to portions of a quantum computer implementation of the computing device 300 in FIG. 3.

The QIP system 600 can include a source 660 that provides atomic species (e.g., a flux of neutral atoms) to a chamber 650 having an ion trap 670 that traps the atomic species once ionized (e.g., photoionized) by an optical controller 620. The chamber 650 may be an example of the vacuum chamber 100 in FIG. 1A. In another aspect, the ion trap 670 may be referred to as a trap, a surface trap, an atom trap, or an atomic lattice that may be configured to trap or confine different atomic species. Optical sources 630 in the optical controller 620 may include one or more laser sources that can be used for ionization of the atomic species, control (e.g., phase control) of the atomic ions, and for fluorescence of the atomic ions that can be monitored and tracked by image processing algorithms operating in an imaging system 640 in the optical controller 620. The imaging system 640 (see e.g., FIG. 6A) can include a high resolution imager (e.g., CCD camera) for monitoring the quantum emitters while they are being provided to the ion trap 670 (e.g., for counting) as described in connection with method 400*a* or after they have been provided to the ion trap 670 (e.g., for monitoring the atomic ions states) as described in connection with method 500, or for monitoring or identifying solid-state quantum emitters as described in the method 400*b*. In an aspect, the imaging system 640 can be implemented separate from the optical controller 620, however, the use of fluorescence to detect, identify, and label atomic ions using image processing algorithms may need to be coordinated with the optical controller 620.

The QIP system 600 may also include an algorithms component 610 that may operate with other parts of the QIP system 600 (not shown) to perform quantum algorithms or quantum operations. As such, the algorithms component 610 may provide instructions to various components of the QIP system 600 (e.g., to the optical controller 620) to enable the implementation of the quantum algorithms or quantum operations.

Figure 6B:
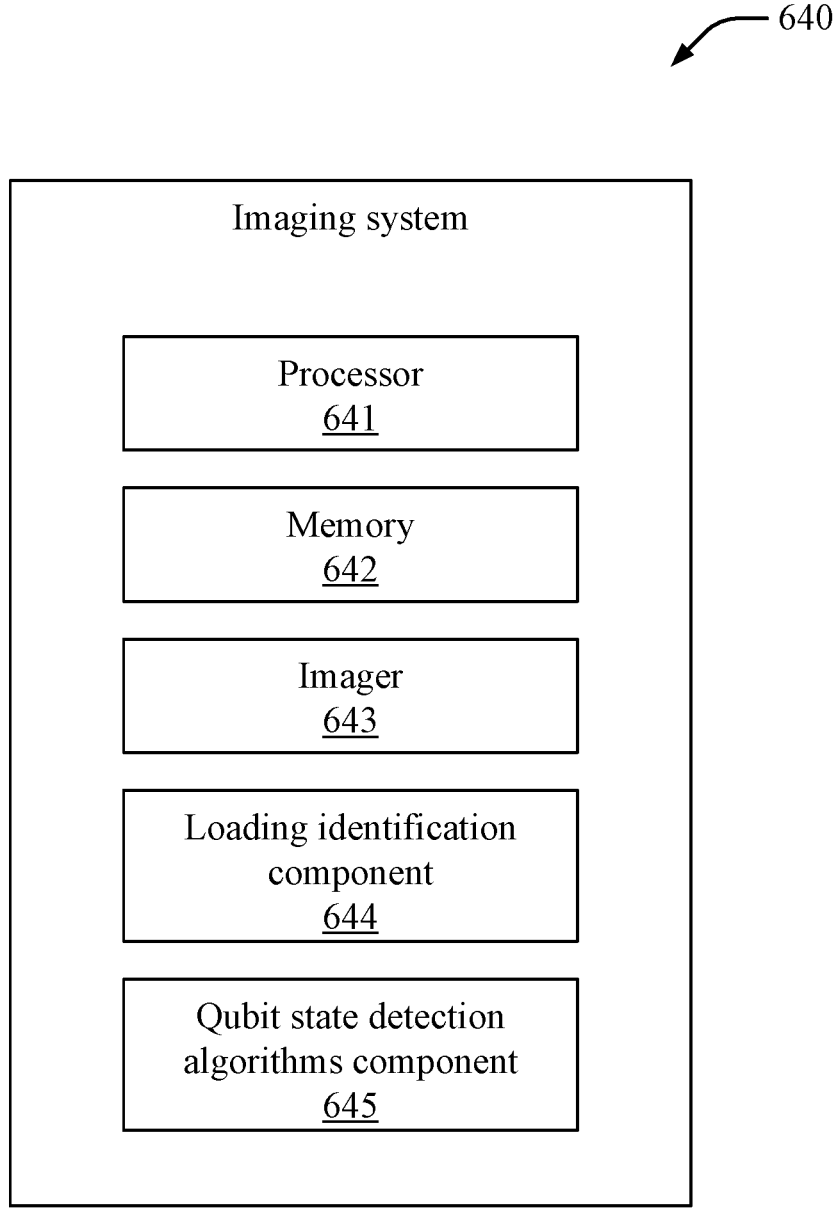
FIG. 6B is a block diagram that illustrates an example of an imaging system in accordance with aspects of this disclosure.

FIG. 6B shows the imaging system 640 of FIG. 6A in more detail by describing examples of subcomponents that may be part of the imaging system 640. In an example, the imaging system 640 may include a processor 641, a memory 642, an imager 643 (e.g., a CCD camera or a CMOS camera), a loading identification component 644, and a qubit state detection algorithms component 645. The processor 641 and the memory 642 may operate together to perform or execute the functions of the imaging system 640 and/or to control the various subcomponents of the imaging system 640. The imager 643 may be used to capture the fluorescence from bright atomic ions or quantum emitters as described above. The loading identification component 644 may be implemented in hardware and/or software and is configured to perform various aspects described herein related to the rapid identification of quantum emitters (e.g., atoms) during loading, including aspects described above in connection with the method 400a. Similarly, the qubit state detection algorithms component 645 may be implemented in hardware and/or software and is configured to perform various aspects described herein related to high efficiency simultaneous detection of qubit states in a lattice of atomic ions or a field of view with quantum emitters, including aspects described above in connection with the method 500. In some implementations, at least some of the functions or operations performed by the loading identification component 644 and/or the qubit state detection algorithms component 645 may be performed by the processor 641 based on instructions, data, or both in the memory 642.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method for identification of optically active quantum systems that include one or more individual quantum emitters, comprising:
   providing an optical source that produces fluorescence from the quantum emitters as the quantum emitters are loaded into a trap, each of the quantum emitters behaving as an optical object having a certain intensity distribution in response to the fluorescence;
   identifying a position of each of the quantum emitters by fitting an overall intensity distribution to a sum of a variable number of Gaussian functions; and
   controlling, in real-time, a number of the quantum emitters that are loaded into the trap based at least on the identified positions of each of the quantum emitters and whether one or more of the quantum emitters are not fluorescing in response to the fluorescence.

2. The method of claim 1, wherein each of the quantum emitters is an atom or a solid-state quantum emitter.

3. The method of claim 1, wherein the identifying of the position of each of the quantum emitters by fitting the overall intensity distribution to the sum of the variable number of Gaussian functions comprises determining peak positions in the overall intensity distribution by calculating the Laplacian of Gaussians whose zeros indicate an inflection point of an intensity distribution for each peak.

4. The method of claim 3, wherein a difference of Gaussians algorithm is used to approximate the Laplacian of Gaussians.

5. The method of claim 1, wherein the identifying of the position of each of the quantum emitters by fitting the overall intensity distribution to the sum of the variable number of Gaussian functions produces regions of local maxima corresponding to a centroid in position of each of the quantum emitters.

6. The method of claim 1, wherein the identifying of the position of each of the quantum emitters by fitting the overall intensity distribution to the sum of the variable number of Gaussian functions comprises:
   determining a relative spacing between quantum emitters based on a number of quantum emitters to be trapped in the trap;
   determining an initial and approximate position of each of the quantum emitters based on the relative spacing; and
   identifying the position of each of the quantum emitters based at least in part of the initial and approximate position of each of the quantum emitters.

7. The method of claim 6, further comprising computing the relative spacing for a lattice of up to 10 quantum emitters, up to 20 quantum emitters, up to 30 quantum emitters, up to 40 quantum emitters, up to 50 quantum emitters, up to 60 quantum emitters, up to 70 quantum emitters, up to 80 quantum emitters, up to 90 quantum emitters, or up to 100 quantum emitters.

8. The method of claim 6, further comprising computing the relative spacing for a lattice having a one-dimensional (1D) conformation, a two-dimensional (2D) conformation, or a three-dimensional (3D) conformation.

9. The method of claim 1, further comprising performing a corrective action when the number of quantum emitters that are loaded into the trap is not a correct number, when an incorrect quantum emitter species is loaded into the trap, or when one or more of the quantum emitters loaded into the trap cannot be properly initialized.

10. A quantum information processing (QIP) system, comprising:
    a quantum emitter lattice having one or more individual quantum emitters;
    an optical controller configured to provide an optical source that produces fluorescence on the quantum emitters as the quantum emitters are loaded into the quantum emitter lattice, each of the quantum emitters behaving as a point-source optical object having a certain intensity in response to the fluorescence; and
    an imaging system configured to:
       identify a position of each of the quantum emitters by fitting an overall intensity distribution to a sum of a variable number of Gaussian functions; and
       control, in real-time, a number of quantum emitters that are loaded into the quantum emitter lattice based at least on the identified positions of each of the quantum emitters and whether any of the quantum emitters is not fluorescing in response to the fluorescence.

11. The QIP system of claim 10, wherein each of the quantum emitters is an atom, an ion, or a solid-state quantum emitter.

12. A non-transitory computer-readable medium storing code with instructions executable by a processor for identification of quantum emitters, comprising:
    code for providing an optical source that produces fluorescence on the quantum emitters as the quantum emitters are loaded into a lattice, each of the quantum emitters behaving as a point-source optical object having a certain intensity in response to the fluorescence;
    code for identifying a position of each of the quantum emitters by fitting an overall intensity distribution to a sum of a variable number of Gaussian functions; and
    code for controlling, in real-time, a number of quantum emitters that are loaded into the lattice based at least on the identified positions of each of the quantum emitters and whether any of the quantum emitters is not fluorescing in response to the fluorescence.

13. A method for identification of optically active quantum systems that include one or more individual quantum emitters, comprising:
- providing an optical source that produces fluorescence from the quantum emitters within an optical field of view, each of the quantum emitters behaving as an optical object having a certain intensity distribution in response to the fluorescence;
- identifying a position of each of the quantum emitters by fitting an overall intensity distribution to a sum of a variable number of Gaussian functions; and
- controlling, in real-time, a number of quantum emitters that are within the field of view based at least on the identified positions of each of the quantum emitters and whether one or more of the quantum emitters are not fluorescing in response to the fluorescence.

14. The method of claim 13, wherein each of the quantum emitters is a solid-state quantum emitter.

15. The method of claim 14, wherein the solid-state quantum emitter is a quantum dot.

* * * * *